United States Patent
Hsu

(10) Patent No.: US 10,325,644 B1
(45) Date of Patent: Jun. 18, 2019

(54) PUMP CIRCUIT IN A DRAM, AND METHOD FOR GENERATING A PUMP CURRENT

(71) Applicant: Nanya Technology Corporation, New Taipei (TW)

(72) Inventor: Ting-Shuo Hsu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/967,069

(22) Filed: Apr. 30, 2018

(51) Int. Cl.
*G11C 11/4074* (2006.01)
*G11C 11/4076* (2006.01)

(52) U.S. Cl.
CPC ...... *G11C 11/4074* (2013.01); *G11C 11/4076* (2013.01)

(58) Field of Classification Search
CPC .................. G11C 11/4074; G11C 11/4076
USPC ..................................... 365/189.09
See application file for complete search history.

(56) References Cited

U.S. PATENT DOCUMENTS

| | | | | |
|---|---|---|---|---|
| 7,630,267 B2 * | 12/2009 | Chen | ...... | G11C 7/04 365/211 |
| 7,929,366 B2 * | 4/2011 | Chen | ...... | G11C 7/04 365/194 |
| 2009/0109782 A1 * | 4/2009 | Chen | ...... | G11C 7/04 365/222 |
| 2010/0061172 A1 * | 3/2010 | Chen | ...... | G11C 7/04 365/211 |
| 2015/0249428 A1 | 9/2015 | Huynh et al. | | |

FOREIGN PATENT DOCUMENTS

KR   20070080492 A   8/2007

OTHER PUBLICATIONS

Taiwan Intellectual Property Office, Office Action, dated Dec. 27, 2018. 5 pages. With English abstract (6 pages).

* cited by examiner

*Primary Examiner* — Harry W Byrne
(74) *Attorney, Agent, or Firm* — Muncy, Geissler, Olds & Lowe, P.C.

(57) ABSTRACT

The present disclosure provides a pump circuit comprising a temperature-sensing module, an oscillating module and a pumping module. The temperature-sensing module is configured to measure a temperature of a dynamic random access memory (DRAM). The oscillating module is coupled to the temperature-sensing module and is configured to generate a clock signal based on the temperature of the DRAM. The pumping module is coupled to the oscillating module and is configured to generate a pump voltage and a pump current to drive the DRAM, wherein the pump current is generated based on an oscillating frequency of the clock signal. When the temperature of the DRAM changes, the oscillating frequency of the clock signal changes based on the temperature of the DRAM, and the pump current correspondingly changes based on the oscillating frequency of the clock signal.

6 Claims, 9 Drawing Sheets

PUMP CIRCUIT IN A DRAM, AND METHOD FOR GENERATING A PUMP CURRENT

TECHNICAL FIELD

The present disclosure relates to a circuit, a dynamic random access memory (DRAM), and a method for generating a current, and more particularly, to a pump circuit, a DRAM, and a method for generating a pump current.

DISCUSSION OF THE BACKGROUND

A conventional DRAM includes a pump circuit including a pumping module configured to generate a pump voltage for the conventional DRAM when a supply voltage of the conventional DRAM is less than a reference voltage. The pump circuit further includes an oscillating module configured to send a clock signal to the pumping module in order to actuate a pumping process of the pumping module.

Generally, with conventional DRAMs, an oscillating frequency of the clock signal is the same as an oscillating frequency of the oscillating module, and has a positive correlation to a pump current generated by the pumping module. When a temperature of the conventional DRAM decreases, a refresh frequency of the conventional DRAM is not required to be maintained at a high value, and the pump current therefore should decrease. However, since the oscillating frequency of the clock signal is fixed, the pump current does not decrease when the temperature of the conventional DRAM decreases. As a result, a power-consumption problem is incurred.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a pump circuit. The pump circuit comprises a temperature-sensing module, an oscillating module and a pumping module. The temperature-sensing module is configured to measure a temperature of a DRAM. The oscillating module is coupled to the temperature-sensing module and is configured to generate a clock signal based on the temperature of the DRAM. The pumping module is coupled to the oscillating module and is configured to generate a pump current to drive the DRAM, wherein the pump current is generated based on an oscillating frequency of the clock signal. In some embodiments, when the temperature of the DRAM changes, the oscillating frequency of the clock signal changes based on the temperature of the DRAM, and the pump current correspondingly changes based on the oscillating frequency of the clock signal.

In some embodiments, the oscillating module includes a first oscillating channel, a second oscillating channel and a third oscillating channel. The first oscillating channel is coupled between the temperature-sensing module and the pumping module, and is configured to generate a first oscillating frequency. The second oscillating channel is coupled in parallel to the first oscillating channel and is configured to generate a second oscillating frequency. The third oscillating channel is coupled in parallel to the first oscillating channel and the second oscillating channel, and is configured to generate a third oscillating frequency. In some embodiments, the first oscillating frequency is less than the second oscillating frequency, and the second oscillating frequency is less than the third oscillating frequency.

In some embodiments, the first oscillating channel has a first resistance and a first capacitance, the second oscillating channel has a second resistance and a second capacitance, and the third oscillating channel has a third resistance and a third capacitance. In some embodiments, the first resistance is greater than the second resistance, and the second resistance is greater than the third resistance. In some embodiments, the first capacitance is greater than the second capacitance, and the second capacitance is greater than the third capacitance.

In some embodiments, the oscillating module includes an oscillating channel coupled between the temperature-sensing module and the pumping module. In some embodiments, the oscillating channel has a variable resistance and a variable capacitance.

Another aspect of the present disclosure provides a DRAM. The DRAM comprises a memory array, a plurality of word lines extending through the memory array, and a pump circuit coupled to the word lines and configured to generate a pump current to drive the DRAM. In some embodiments, the pump circuit includes a temperature-sensing module, an oscillating module and a pumping module. The temperature-sensing module is configured to measure a temperature of the DRAM. The oscillating module is coupled to the temperature-sensing module and is configured to generate a clock signal based on the temperature of the DRAM. The pumping module is coupled to the oscillating module and is configured to generate the pump current to drive the DRAM, wherein the pump current is generated based on an oscillating frequency of the clock signal. In some embodiments, when the temperature of the DRAM changes, the oscillating frequency of the clock signal changes based on the temperature of the DRAM, and the pump current correspondingly changes based on the oscillating frequency of the clock signal.

In some embodiments, the oscillating module includes a first oscillating channel, a second oscillating channel and a third oscillating channel. The first oscillating channel is coupled between the temperature-sensing module and the pumping module, and is configured to generate a first oscillating frequency. The second oscillating channel is coupled in parallel to the first oscillating channel and is configured to generate a second oscillating frequency. The third oscillating channel is coupled in parallel to the first oscillating channel and the second oscillating channel, and is configured to generate a third oscillating frequency. In some embodiments, the first oscillating frequency is less than the second oscillating frequency, and the second oscillating frequency is less than the third oscillating frequency.

In some embodiments, the first oscillating channel has a first resistance and a first capacitance, the second oscillating channel has a second resistance and a second capacitance, and the third oscillating channel has a third resistance and a third capacitance. In some embodiments, the first resistance is greater than the second resistance, and the second resistance is greater than the third resistance. In some embodiments, the first capacitance is greater than the second capacitance, and the second capacitance is greater than the third capacitance.

In some embodiments, the oscillating module includes an oscillating channel coupled between the temperature-sensing module and the pumping module. In some embodiments, the oscillating channel has a variable resistance and a variable capacitance.

Another aspect of the present disclosure provides a method for controlling an oscillating frequency of a clock signal. The method comprises the following steps. A temperature of a DRAM is measured. A numerical signal is generated based on the temperature of the DRAM. A clock signal with an oscillating frequency is generated based on the numerical signal. A pump current is generated based on the oscillating frequency of the clock signal.

In some embodiments, when the temperature of the DRAM changes, the oscillating frequency of the clock signal changes in positive correlation to the temperature of the DRAM.

In some embodiments, the pump current is generated to drive the DRAM when a supply voltage of the DRAM is less than a reference voltage.

In some embodiments, the step of generating the clock signal with the oscillating frequency based on the numerical signal is performed by converting the numerical signal into the clock signal using one of a plurality of oscillating channels having different resistances and capacitances.

In some embodiments, the step of generating the clock signal with the oscillating frequency based on the numerical signal includes passing the numerical signal through one of the plurality of oscillating channels based on the temperature of the DRAM.

In some embodiments, the plurality of oscillating channels generate clock signals with different oscillating frequencies.

In some embodiments, the step of generating the clock signal with the oscillating frequency based on the numerical signal is performed by converting the numerical signal into the clock signal using an oscillating channel having a variable resistance and a variable capacitance.

In some embodiments, when the temperature state of the DRAM changes, an RC value of the oscillating channel is changed for generating a corresponding oscillating frequency of the clock signal.

With the above-mentioned configurations of the pump circuit, an oscillating frequency of a clock signal can be varied to change a pump current based on a temperature of a DRAM. As a result, the power-consumption problem is solved. Consequently, the disadvantages of a conventional pump circuit can be alleviated.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
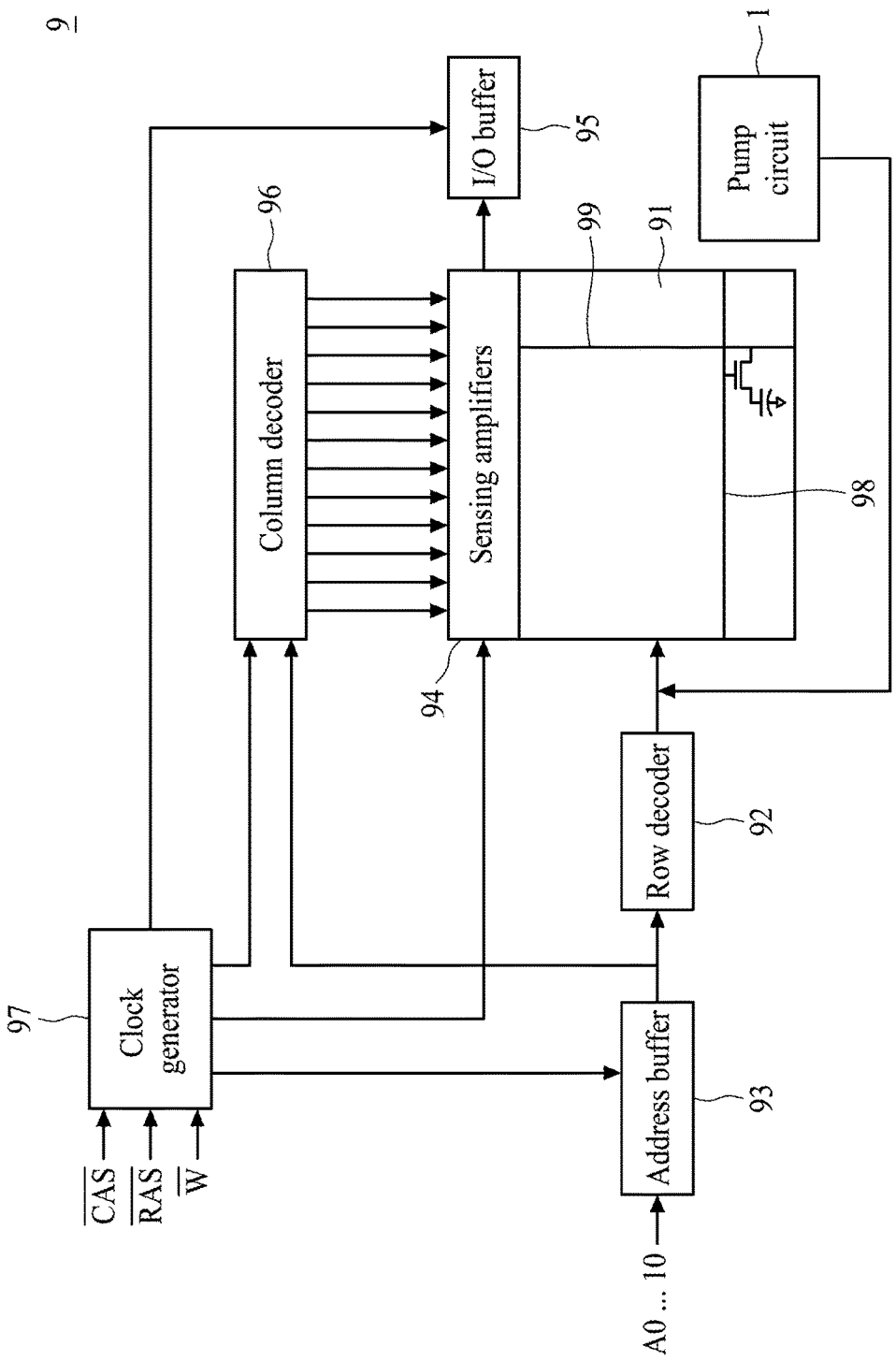
FIG. 1 is a block diagram of a DRAM in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a block diagram of a DRAM 9 in accordance with some embodiments of the present disclosure. Referring to FIG. 1, in some embodiments, the DRAM 9 includes a memory array 91; a row decoder 92 coupled to the memory array 91; an address buffer 93 coupled to the row decoder 92; a plurality of sensing amplifiers 94 coupled to the memory array 91; an I/O buffer 95 coupled to the sensing amplifiers 94; a column decoder 96 coupled to the sensing amplifiers 94; a clock generator 97 coupled to the address buffer 93, the column decoder 96, the sensing amplifiers 94 and the I/O buffer 95; a plurality of word lines 98 extending through the memory array 91; and a plurality of bit lines 99 extending through the memory array 91 and intersecting the plurality of word lines 98.

Figure 2:
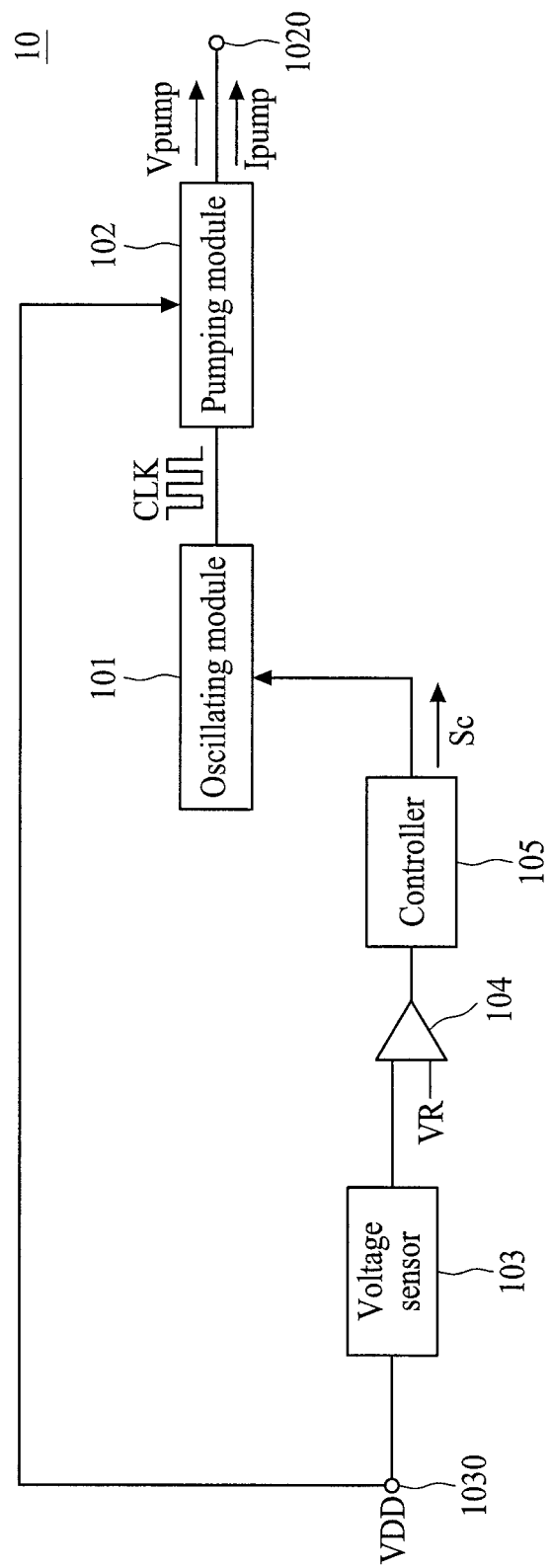
FIG. 2 is a block diagram of a comparative pump circuit.

FIG. 2 is a block diagram of a comparative pump circuit 10. Referring to FIG. 2, the comparative pump circuit 10 comprises an oscillating module 101, a pumping module 102 coupled between the oscillating module 101 and a pump output 1020, a voltage sensor 103 coupled to a voltage input 1030, a comparator 104 coupled to the voltage sensor 103, and a controller 105 coupled between the comparator 104 and the oscillating module 101. The voltage input 1030 and the pump output 1020 are coupled to the word lines 98 of the DRAM 9. The voltage sensor 103 measures a supply voltage (VDD) of the DRAM 9 through the voltage input 1030, and the supply voltage (VDD) of the DRAM 9 is compared with a reference voltage (VR). The controller 105 receives a voltage comparison information from the comparator 104, sends a control signal (Sc) to the oscillating module 101 to actuate a pumping process when the supply voltage (VDD) of the DRAM 9 is less than the reference voltage (VR), and sends another control signal (Sc) to the oscillating module 101 to stop the pumping process when the supply voltage (VDD) of the DRAM 9 is equal to or greater than the reference voltage (VR). During the pumping process, the oscillating module 101 sends a clock signal with an oscillating frequency to the pumping module 102, and the pumping module 102 generates a pump voltage (Vpump) and a pump current (Ipump) through the pump output 1020 to drive the DRAM 9. Because the pump current (Ipump) has a positive correlation to the oscillating frequency of the clock signal, when the oscillating frequency of the clock signal is fixed, the pump current (Ipump) is correspondingly fixed.

During operation of the comparative pump circuit 10, when the temperature of the DRAM 9 decreases, there is no need to maintain a high refresh frequency for the DRAM 9 in order to prevent data loss, and a high pump current (Ipump) is not necessary to drive the DRAM 9. As a result, because the refresh frequency and the pump current (Ipump) are unnecessarily high, the DRAM 9 using the comparative pump circuit 10 consumes unnecessary power, and a power-consumption problem is thereby incurred.

Figure 3:
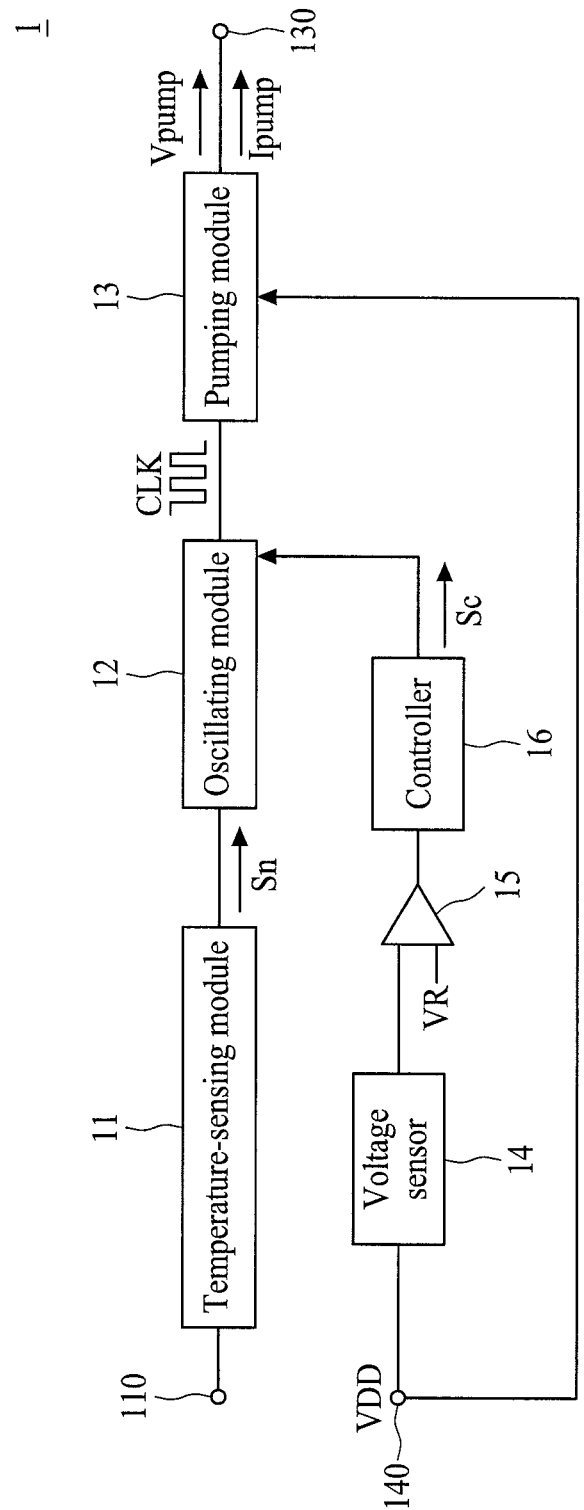
FIG. 3 is a block diagram of a pump circuit in accordance with some embodiments of the present disclosure.

FIG. 3 is a block diagram of the pump circuit 1 in accordance with some embodiments of the present disclosure. Referring to FIG. 1 and FIG. 3, in some embodiments, the pump circuit 1 comprises a temperature-sensing module 11, an oscillating module 12, a pumping module 13, a voltage sensor 14, a comparator 15 and a controller 16. In some embodiments, a temperature input 110 is coupled to the DRAM 9, and the temperature-sensing module 11 is configured to measure a temperature of the DRAM 9 through the temperature input 110. In some embodiments, the oscillating module 12 is coupled to the temperature-sensing module 11 and configured to generate a clock signal.

In some embodiments, the pumping module 13 is coupled between the oscillating module 12 and a pump output 130, and the pump output 130 is further coupled to the word lines 98 of the DRAM 9. In some embodiments, when the supply voltage (VDD) of the DRAM 9 is less than the reference voltage (VR), the pumping module 13 is configured to generate a pump voltage (Vpump) and a pump current (Ipump) through the pump output 130 to drive the DRAM 9. In some embodiments, when the temperature of the DRAM 9 changes, the oscillating frequency of the clock signal changes based on the temperature of the DRAM 9, and the pump current (Ipump) correspondingly changes based on the oscillating frequency of the clock signal.

In some embodiments, the voltage sensor 14 is coupled to a voltage input 140, which is further coupled to the word lines 98 of the DRAM 9. In some embodiments, the voltage sensor 14 is configured to measure the supply voltage (VDD) of the DRAM 9 through the voltage input 140.

In some embodiments, the comparator 15 is coupled to the voltage sensor 14 and is configured to compare the supply voltage (VDD) of the DRAM 9 with the reference voltage (VR). In some embodiments, the controller 16 is coupled between the comparator 15 and the oscillating module 12, and is configured to send control signals (Sc) to the oscillating module 12 to actuate or stop a pumping process.

Figure 4A:
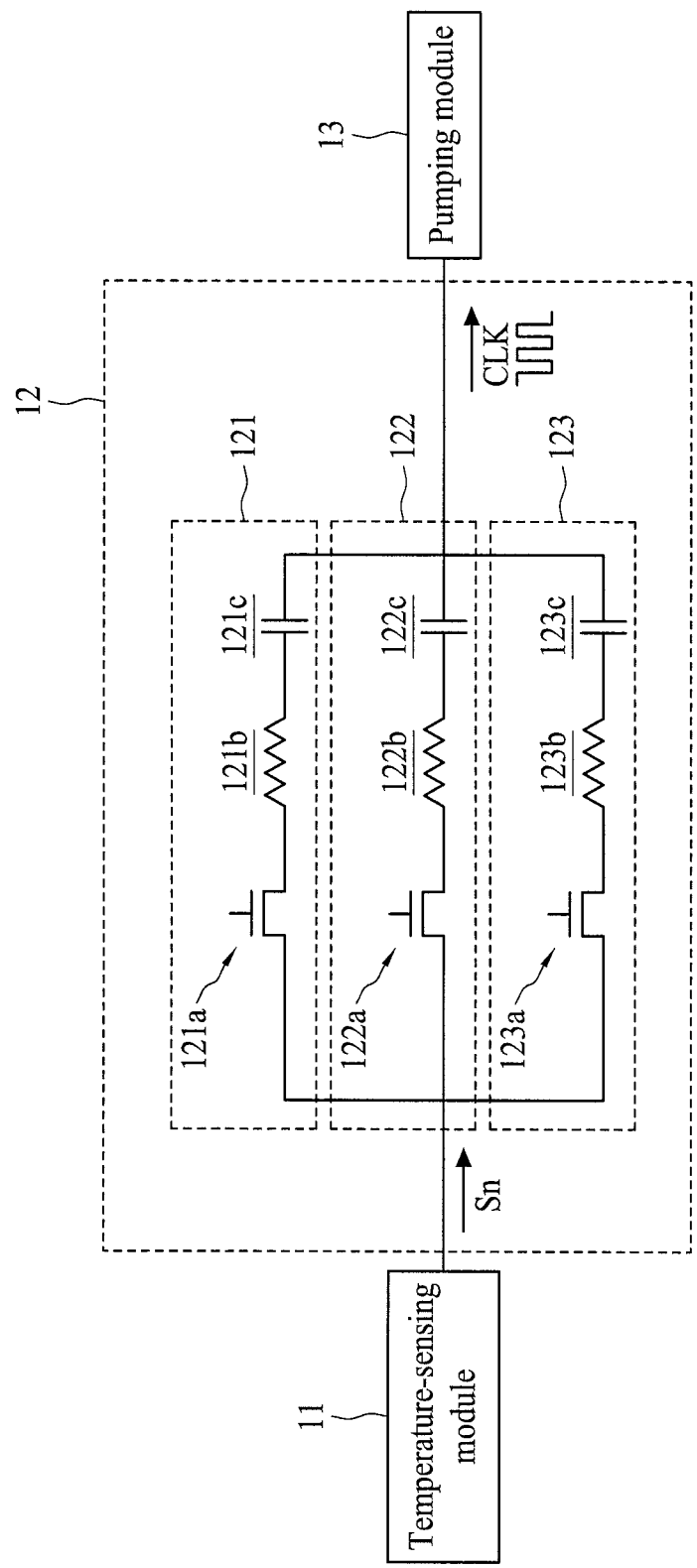
FIG. 4A is a block diagram of an oscillating module of the pump circuit in accordance with some embodiments of the present disclosure.

FIG. 4A is a block diagram of the oscillating module 12 of the pump circuit 1 in accordance with some embodiments of the present disclosure. Referring to FIG. 3 and FIG. 4A, in some embodiments, the oscillating module 12 includes a first oscillating channel 121, a second oscillating channel 122 and a third oscillating channel 123. In some embodiments, the first oscillating channel 121 is coupled between the temperature-sensing module 11 and the pumping module 13, and includes a first transistor 121a coupled to the temperature-sensing module 11, a first resistor 121b coupled to the first transistor 121a, and a first capacitor 121c coupled between the first resistor 121b and the pumping module 13. In some embodiments, the second oscillating channel 122 is coupled between the temperature-sensing module 11 and the pumping module 13, i.e., in parallel to the first oscillating channel 121, and includes a second transistor 122a coupled to the temperature-sensing module 11, a second resistor 122b coupled to the second transistor 122a, and a second capacitor 122c coupled between the second resistor 122b and the pumping module 13. In some embodiments, the third oscillating channel 123 is coupled between the temperature-sensing module 11 and the pumping module 13, i.e., in parallel to the first oscillating channel 121 and the second oscillating channel 122, and includes a third transistor 123a coupled to the temperature-sensing module 11, a third resistor 123b coupled to the third transistor 123a, and a third capacitor 123c coupled between the third resistor 123b and the pumping module 13.

In some embodiments, a first resistance (R1) of the first resistor 121b is greater than a second resistance (R2) of the second resistor 122b, and the second resistance (R2) of the second resistor 122b is greater than a third resistance (R3) of the third resistor 123b. In some embodiments, a first capacitance (C1) of the first capacitor 121c is greater than a second capacitance (C2) of the second capacitor 122c, and the second capacitance (C2) of the second capacitor 122c is greater than a third capacitance (C3) of the third capacitor 123c. Therefore, in some embodiments, an RC value of the first oscillating channel 121 is greater than an RC value of the second oscillating channel 122, and the RC value of the second oscillating channel 122 is greater than an RC value of the third oscillating channel 123.

In some embodiments, the first oscillating channel 121 generates the clock signal with a first oscillating frequency (F1), the second oscillating channel 122 generates the clock signal with a second oscillating frequency (F2), and the third oscillating channel 123 generates the clock signal with a third oscillating frequency (F3). In some embodiments, the first oscillating frequency (F1) is less than the second oscillating frequency (F2), and the second oscillating frequency (F2) is less than the third oscillating frequency (F3).

In other embodiments, the first, second and third resistors 121b, 122b and 123b may be omitted; in such a manner, the first, second and third transistors 121a, 122a and 123a are configured to respectively generate the first, second and third resistances (R1, R2, R3).

In some embodiments, when the first, second and third transistors 121a, 122a and 123a are configured to respectively generate the first, second and third resistances (R1, R2, R3), the first, second and third transistors 121a, 122a and 123a are implemented by a plurality of metal-oxide-semiconductor field-effect transistors (MOSFETs). In some embodiments, each of the first, second and third transistors 121a, 122a and 123a includes a gate, a drain and a source, and when the first, second and third transistors 121a, 122a and 123a are actuated, each of the first, second and third transistors 121a, 122a and 123a has a linear resistance defined as a drain-source on resistance (RDS). In some embodiments, the first, second and third resistances (R1, R2, R3) are implemented by respective RDSs of the first, second and third transistors 121a, 122a and 123a.

Since the RDS is controlled by a gate-to-source voltage, the RDS can be changed by adjusting the gate-to-source voltage. Consequently, the first, second and third resistances (R1, R2, R3) can be implemented by the first, second and third transistors 121a, 122a and 123a at different gate-to-source voltages.

Figure 4B:
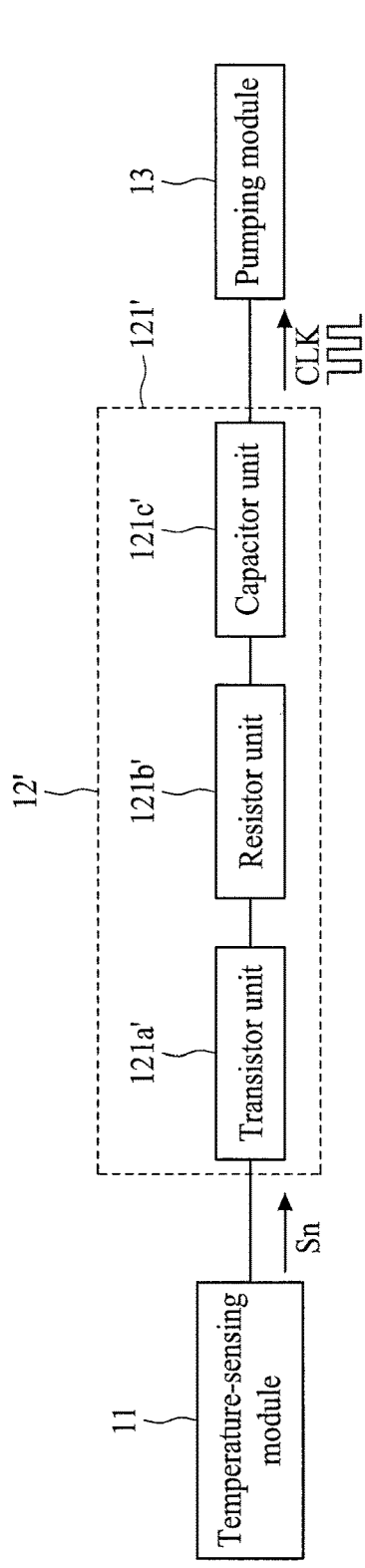
FIG. 4B is a block diagram of another oscillating module of the pump circuit in accordance with some embodiments of the present disclosure.

FIG. 4B is a block diagram of an oscillating module 12' of the pump circuit 1 in accordance with some embodiments of the present disclosure. Referring to FIG. 3 and FIG. 4B, in some embodiments, the oscillating module 12' includes an oscillating channel 121' coupled between the temperature-sensing module 11 and the pumping module 13. In some embodiments, the oscillating channel 121' includes a transistor unit 121a' coupled to the temperature-sensing module 11 and including a plurality of transistors, a resistor unit 121b' coupled to the transistor unit 121a' and including a plurality of resistors, and a capacitor unit 121c' coupled between the resistor unit 121b' and the pumping module 13 and including a plurality of capacitors. In some embodiments, an RC value of the oscillating channel 121' changes when the temperature of the DRAM 9 changes; that is, the RC value of the oscillating channel 121' is changed by controlling the transistors of the transistor unit 121a' to adjust a quantity of active resistors of the resistor unit 121b' and a quantity of active capacitors of the capacitor unit 121c'.

In other embodiments, the resistor unit 121b' may be omitted; in such embodiments, the transistor unit 121a' is configured to generate and change a resistance for the oscillating channel 121'.

In some embodiments, when the transistor unit 121a' is configured to generate and change a resistance for the oscillating channel 121', the transistors of the transistor unit 121a' are implemented by the MOSFETs. Similarly, in some embodiments, each of the transistors of the transistor unit 121a' has the RDS, and the resistance for the oscillating channel 121' is implemented by the plurality of RDSs of the transistor unit 121a'. Therefore, the overall resistance of the oscillating channel 121' can also be changed by adjusting the plurality of gate-to-source voltages of the transistors of the transistor unit 121a'.

Figure 5:
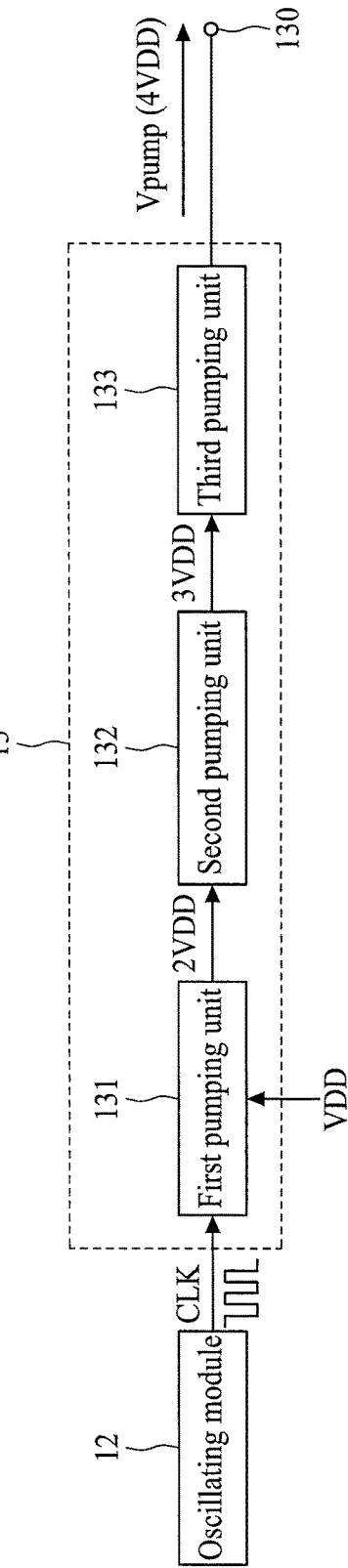
FIG. 5 is a block diagram of a pumping module of the pump circuit in accordance with some embodiments of the present disclosure.

FIG. 5 is a block diagram of the pumping module 13 of the pump circuit 1 in accordance with some embodiments of the present disclosure. Referring to FIG. 5, in some embodiments, the pumping module 13 includes a first pumping unit 131 coupled to the oscillating module 12, a second pumping unit 132 coupled to the first pumping unit 131, and a third pumping unit 133 coupled between the second pumping unit 132 and the pump output 130. In some embodiments, the quantity of the pumping units of the pumping module 13 may be varied. In some embodiments, the supply voltage (VDD) of the DRAM 9 is pumped in response to the clock signal and is raised in equal proportion after sequentially passing through the first pumping unit 131, the second pumping unit 132 and the third pumping unit 133. Therefore, the quantity of the pumping units of the pumping module 13 is determined based on a pumping requirement of the pump voltage (Vpump) for the DRAM 9.

Referring to FIG. 5, in some embodiments, since the supply voltage (VDD) of the DRAM 9 is raised in equal proportion after passing through each of the three pumping units 131, 132 and 133, a first raised voltage is two times the supply voltage (VDD) of the DRAM 9 after passing through the first pumping unit 131, a second raised voltage is three times the supply voltage (VDD) of the DRAM 9 after passing through the second pumping unit 132, and a final raised voltage is four times the supply voltage (VDD) of the DRAM 9 after passing through the third pumping unit 133 and is configured as the pump voltage (Vpump). In other embodiments, such configuration may be varied.

Figure 6:
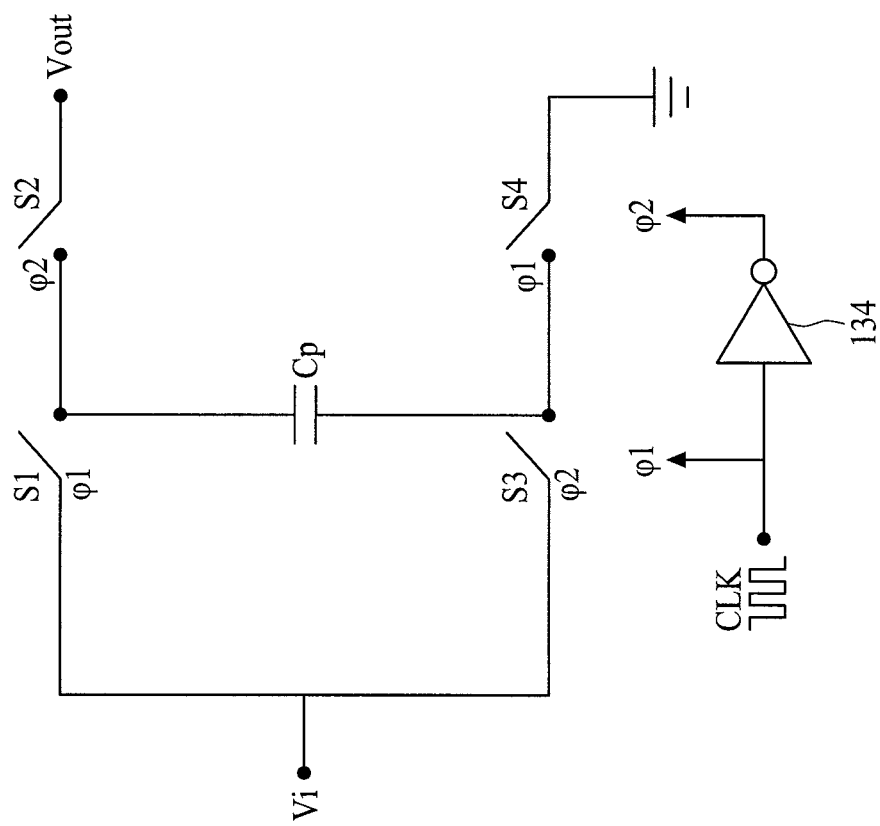
FIG. 6 is a schematic circuit of a pumping unit of the pumping module of the pump circuit in accordance with some embodiments of the present disclosure.

FIG. 6 is a schematic circuit of a pumping unit of the pumping module 13 of the pump circuit 1 in accordance with some embodiments of the present disclosure. Referring to FIG. 6, in some embodiments, each of the first, second and third pumping units 131, 132 and 133 includes a first switch (S1), a second switch (S2), a third switch (S3), a fourth switch (S4), a pumping capacitor (Cp) and a logic gate 134.

Referring to FIG. 6, during a pumping process of each of the first, second and third pumping units 131, 132 and 133, in some embodiments, in the first half cycle, the first switch (S1) and the fourth switch (S4) are closed, the second switch (S2) and the third switch (S3) are open, and the pumping capacitor (Cp) is charged to be the same as an input voltage (Vi). In some embodiments, in the second half cycle, the first switch (S1) and the fourth switch (S4) are open, the second switch (S2) and the third switch (S3) are closed, and an output voltage (Vout) is two times the input voltage (Vi) (for example, Vout=Vi(input)+Vi(charged in Cp)).

In some embodiments, the logic gate 134 is configured to drive a periodic switching of the first, second, third and fourth switches (S1, S2, S3, S4), and the switching frequency of the first, second, third and fourth switches (S1, S2, S3, S4) is determined based on the oscillating frequency of the clock signal. In some embodiments, the logic gate 134 is configured as an inverter, while, in other embodiments, the configuration of the logic gate 134 may be varied.

In some embodiments, if the oscillating frequency of the clock signal is low, the switching frequency of the first, second, third and fourth switches (S1, S2, S3, S4) is low and charging the pumping capacitor (Cp) takes more time; in contrast, if the oscillating frequency of the clock signal is high, the switching frequency of the first, second, third and fourth switches (S1, S2, S3, S4) is high and charging the pumping capacitor (Cp) charges takes less time, i.e., the charging is faster. Viewed from another aspect, with a fixed pump time, when the oscillating frequency of the clock signal is low, the pumping capacitor (Cp) is charged with a smaller electric charge and therefore outputs a smaller pump current (Ipump), and when the oscillating frequency of the clock signal is high, the pumping capacitor (Cp) is charged with a greater electric charge and therefore outputs a greater pump current (Ipump). Consequently, the pump current (Ipump) has a positive correlation to the oscillating frequency of the clock signal.

The comparative pump circuit 10 does not include a temperature-sending module, and therefore the oscillating frequency of the clock signal and the pump current (Ipump) does not change when the temperature of the DRAM 9 changes. In contrast, the pump circuit 1 of the present disclosure includes the temperature-sensing module 11, and the temperature of the DRAM 9 can be measured for determining the oscillating frequency of the clock signal. In addition, the oscillating frequency of the clock signal is not fixed because the RC value of the oscillating module 12 (or the oscillating module 12') of the present disclosure is not fixed. As a result, the pump current (Ipump) can be varied with the change of the oscillating frequency of the clock signal (the temperature of the DRAM 9), and the power-consumption problem can be solved.

Figure 7:
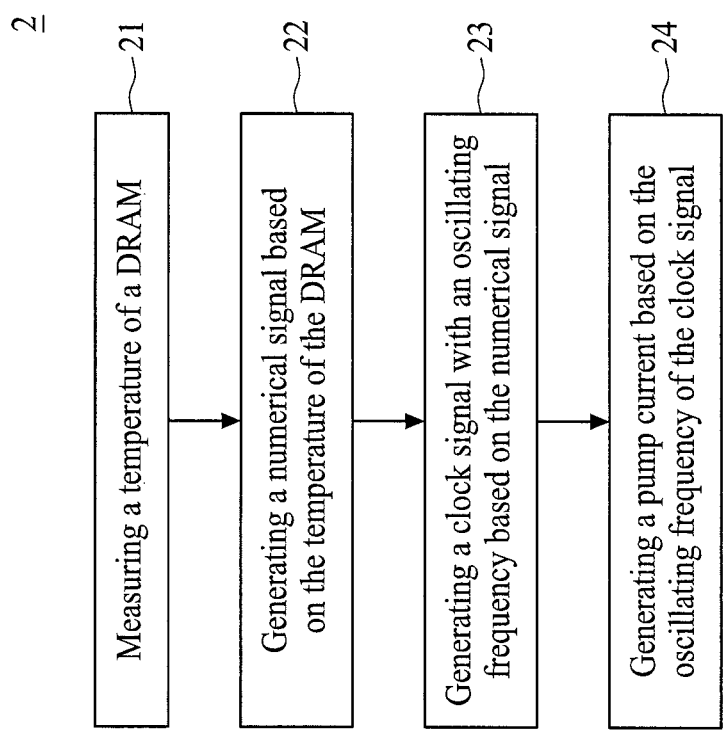
FIG. 7 is a flowchart illustrating a method for controlling an oscillating frequency of a clock signal in accordance with some embodiments of the present disclosure.

FIG. 7 is a flowchart illustrating a method 2 for controlling the oscillating frequency of the clock signal in accordance with some embodiments of the present disclosure. Referring to FIG. 7, in some embodiments, the method 2 includes a step 21, in which the temperature of the DRAM 9 is measured; a step 22, in which the numerical signal (Sn) is generated based on the temperature of the DRAM 9; a step 23, in which the clock signal with the oscillating frequency is generated based on the numerical signal (Sn); and a step 24, in which the pump current (Ipump) is generated based on the oscillating frequency of the clock signal.

Referring to FIG. 4A and FIG. 7, in some embodiments, the step of generating the clock signal with the oscillating frequency based on the numerical signal (Sn) is performed by converting the numerical signal (Sn) into the clock signal using one of the first oscillating channel 121, the second oscillating channel 122 and the third oscillating channel 123, based on the temperature of the DRAM 9.

Referring to FIG. 4B and FIG. 7, in some embodiments, the step of generating the clock signal with the oscillating frequency based on the numerical signal (Sn) is performed by converting the numerical signal (Sn) into the clock signal using the oscillating channel 121' of the oscillating module 12'.

Figure 8:
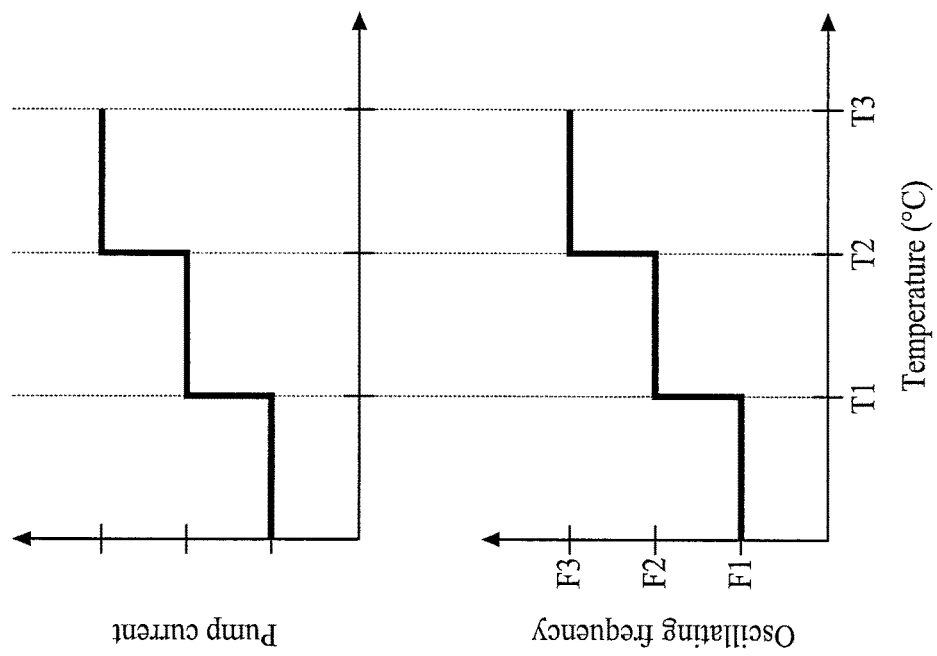
FIG. 8 is a schematic plot illustrating the relationship between a temperature of the DRAM and the oscillating frequency of the clock signal, and the relationship between the temperature of the DRAM and a pump current.

FIG. 8 is a schematic plot illustrating the relationship between the temperature of the DRAM 9 and the oscillating frequency of the clock signal, and the relationship between the temperature of the DRAM 9 and the pump current (Ipump). Referring to FIG. 8, in some embodiments, when the temperature of the DRAM 9 is less than a first preset temperature (T1), the DRAM 9 is considered to be in a LOW TEMPERATURE state; when the temperature of the DRAM 9 is between the first preset temperature (T1) and a second preset temperature (T2), the DRAM 9 is considered to be in a NORMAL TEMPERATURE state; and when the temperature of the DRAM 9 is greater than the second preset temperature (T2), the DRAM 9 is considered to be in a HIGH TEMPERATURE state. In other embodiments, temperature ranges of the DRAM 9 that define different temperature states may be varied.

In some embodiments, the first preset temperature (T1) is zero degrees Celsius and the second preset temperature (T2) is 130 degrees Celsius, while, in other embodiments, the values of the first and second preset temperatures (T1, T2) may be varied.

In some embodiments, when the temperature of the DRAM 9 changes, the oscillating frequency of the clock signal changes in positive correlation to the temperature of the DRAM 9. Referring to FIG. 8, in some embodiments, when the DRAM 9 changes from the LOW TEMPERATURE state to the NORMAL TEMPERATURE state, both the oscillating frequency of the clock signal and the pump current (Ipump) are correspondingly increased, and when the DRAM 9 changes from the NORMAL TEMPERATURE state to the HIGH TEMPERATURE state, both the oscillating frequency of the clock signal and the pump current (Ipump) are correspondingly increased.

In some embodiments, when the DRAM 9 is in the LOW TEMPERATURE state, the numerical signal (Sn) passes through the first oscillating channel 121 to be converted into the clock signal which has the first oscillating frequency (F1); when the DRAM 9 is in the NORMAL TEMPERATURE state, the numerical signal (Sn) passes through the second oscillating channel 122 to be converted into the clock signal which has the second oscillating frequency (F2); and when the DRAM 9 is in the HIGH TEMPERATURE state, the numerical signal (Sn) passes through the third oscillating channel 123 to be converted into the clock signal which has the third oscillating frequency (F3).

Referring back to FIG. 3, in some embodiments, during the pumping process, the voltage sensor 14 measures the supply voltage (VDD) of the DRAM 9 and sends a voltage information to the comparator 15. The comparator 15 then compares the supply voltage (VDD) of the DRAM 9 with the reference voltage (VR), and sends a voltage comparison information to the controller 16. Subsequently, if the supply voltage (VDD) of the DRAM 9 is less than the reference voltage (VR), the controller 16 sends the control signal (Sc) to the pumping module 13 to generate the pump voltage (Vpump) and the pump current (Ipump) to drive the DRAM 9; and if the supply voltage (VDD) of the DRAM 9 is equal to or greater than the reference voltage (VR), the controller 16 sends the control signal (Sc) to the pumping module 13 to stop generating the pump voltage (Vpump) and the pump current (Ipump).

Figure 9:
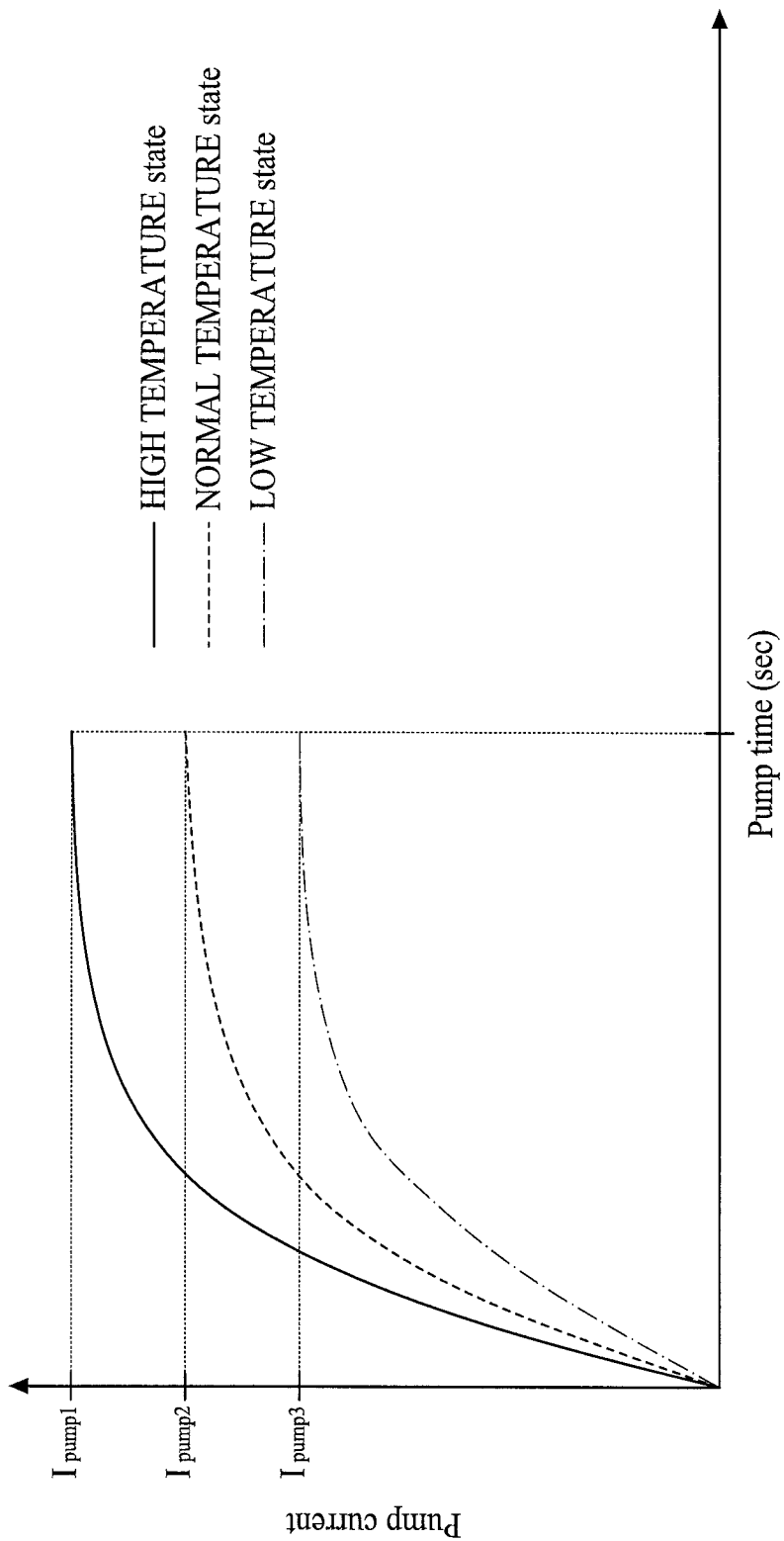
FIG. 9 is a schematic plot illustrating the relationship between pump time and the pump current in three different temperature states.

FIG. 9 is a schematic plot illustrating the relationship between the pump time and the pump current (Ipump) in three different temperature states. Referring to FIG. 9, in some embodiments, when the DRAM 9 is in the HIGH TEMPERATURE state, the pumping module 13 generates a first pump current (Ipump1); when the DRAM 9 is in the NORMAL TEMPERATURE state, the pumping module 13 generates a second pump current (Ipump2); and when the DRAM 9 is in the LOW TEMPERATURE state, the pumping module 13 generates a third pump current (Ipump3).

In some embodiments, during a period of the pump time, a rate of increase of the first pump current (Ipump1) is greater than a rate of increase of the second pump current (Ipump2), and the rate of increase of the second pump current (Ipump2) is greater than a rate of increase of the third pump current (Ipump3).

In some embodiments, at a fixed pump time, the first pump current (Ipump1) is greater than the second pump current (Ipump2), and the second pump current (Ipump2) is greater than the third pump current (Ipump3).

In the comparative pump circuit 10, during the pumping process, the pumping module 102 generates the fixed pump current (Ipump) since the oscillating frequency of the clock signal is fixed. In contrast, in the pump circuit 1 of the present disclosure, during the pumping process, the temperature of the DRAM 9 can be measured for determining the oscillating frequency of the clock signal, and the oscillating frequency of the clock signal is not fixed and has a positive correlation to the pump current (Ipump). Therefore, the pump current (Ipump) can be varied according to the change of the temperature of the DRAM 9.

In conclusion, with the configuration of the temperature-sensing module 11, the pump circuit 1 of the present disclosure can generate the pump current (Ipump) based on the oscillating frequency of the clock signal to drive the DRAM 9. As a result, the power-consumption problem can be solved.

One aspect of the present disclosure provides a pump circuit. The pump circuit comprises a temperature-sensing module, an oscillating module and a pumping module. The temperature-sensing module is configured to measure a temperature of a DRAM. The oscillating module is coupled to the temperature-sensing module and is configured to generate a clock signal based on the temperature of the DRAM. The pumping module is coupled to the oscillating module and is configured to generate a pump voltage and a pump current to drive the DRAM, wherein the pump current is generated based on an oscillating frequency of the clock signal. In some embodiments, when the temperature of the DRAM changes, the oscillating frequency of the clock signal changes based on the temperature of the DRAM, and the pump current correspondingly changes based on the oscillating frequency of the clock signal.

One aspect of the present disclosure provides a DRAM. The DRAM comprises a memory array, a plurality of word lines extending through the memory array, and a pump circuit coupled to the word lines and configured to generate a pump current to drive the DRAM. In some embodiments, the pump circuit comprises a temperature-sensing module, an oscillating module and a pumping module. The temperature-sensing module is configured to measure a temperature of the DRAM. The oscillating module is coupled to the temperature-sensing module and is configured to generate a clock signal based on the temperature of the DRAM. The pumping module is coupled to the oscillating module and is configured to generate the pump current to drive the DRAM, wherein the pump current is generated based on an oscillating frequency of the clock signal. In some embodiments, when the temperature of the DRAM changes, the oscillating frequency of the clock signal changes based on the temperature of the DRAM, and the pump current correspondingly changes based on the oscillating frequency of the clock signal.

One aspect of the present disclosure provides a method for controlling an oscillating frequency of a clock signal. The method comprises the following steps. A temperature of a DRAM is measured. A numerical signal is generated based on the temperature of the DRAM. A clock signal with an oscillating frequency is generated based on the numerical signal. A pump current is generated based on the oscillating frequency of the clock signal.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A pump circuit, comprising:
    a temperature-sensing module configured to measure a temperature of a dynamic random access memory (DRAM);
    an oscillating module coupled to the temperature-sensing module and configured to generate a clock signal based on the temperature of the DRAM; and
    a pumping module coupled to the oscillating module and configured to generate a pump current to drive the DRAM, wherein the pump current is generated based on an oscillating frequency of the clock signal;
    wherein when the temperature of the DRAM changes, the oscillating frequency of the clock signal changes based on the temperature of the DRAM, and the pump current correspondingly changes based on the oscillating frequency of the clock signal.

2. The pump circuit of claim 1, wherein the oscillating module includes:
    a first oscillating channel coupled between the temperature-sensing module and the pumping module, and configured to generate a first oscillating frequency; and
    a second oscillating channel coupled in parallel to the first oscillating channel and configured to generate a second oscillating frequency;
    wherein the first oscillating frequency is less than the second oscillating frequency.

3. The pump circuit of claim 2, wherein the oscillating module further includes:
    a third oscillating channel coupled in parallel to the first oscillating channel and the second oscillating channel, and configured to generate a third oscillating frequency;
    wherein the second oscillating frequency is less than the third oscillating frequency.

4. The pump circuit of claim 3, wherein the first oscillating channel has a first resistance and a first capacitance, the second oscillating channel has a second resistance and a second capacitance, the first resistance is greater than the second resistance, and the first capacitance is greater than the second capacitance.

5. The pump circuit of claim 4, wherein the third oscillating channel has a third resistance and a third capacitance, the second resistance is greater than the third resistance, and the second capacitance is greater than the third capacitance.

6. The pump circuit of claim 1, wherein:
    the oscillating module includes an oscillating channel coupled between the temperature-sensing module and the pumping module; and
    the oscillating channel has a variable resistance and a variable capacitance.

* * * * *